United States Patent
Izumi et al.

(10) Patent No.: US 6,613,463 B1
(45) Date of Patent: Sep. 2, 2003

(54) SUPERCONDUCTING LAMINATED OXIDE SUBSTRATE AND SUPERCONDUCTING INTEGRATED CIRCUIT

(75) Inventors: Teruo Izumi, Tokyo (JP); Satoshi Koyama, Tokyo (JP); Yuh Shiohara, Tokyo (JP); Shoji Tanaka, Tokyo (JP); Masahiro Egami, Tokyo (JP); Youichi Enomoto, Tokyo (JP); Hideo Suzuki, Tokyo (JP); Michitomo Iiyama, Tokyo (JP)

(73) Assignee: International Superconductivity Technology Center, Tokyo (JP)

( * ) Notice: Subject to any disclaimer, the term of this patent is extended or adjusted under 35 U.S.C. 154(b) by 88 days.

(21) Appl. No.: 09/653,404

(22) Filed: Sep. 1, 2000

(30) Foreign Application Priority Data

Sep. 6, 1999 (JP) .............................. 11-252309
Sep. 29, 1999 (JP) ............................ 11-277616

(51) Int. Cl.$^7$ ........................ B32B 19/00; B32B 9/00; H01L 39/00; H01L 39/24
(52) U.S. Cl. ................. 428/700; 428/702; 428/930; 505/234; 505/238; 505/230; 505/430; 505/500
(58) Field of Search ................. 428/699, 700, 428/701, 702, 730; 505/234, 237, 230, 238, 813

(56) References Cited

U.S. PATENT DOCUMENTS

| | | | | | |
|---|---|---|---|---|---|
| 5,047,390 A | * | 9/1991 | Higashino et al. | ............. | 257/33 |
| 5,252,543 A | * | 10/1993 | Tanaka et al. | ............. | 428/688 |
| 5,407,903 A | * | 4/1995 | Nakamura et al. | ............. | 257/36 |
| 5,413,982 A | * | 5/1995 | Inada et al. | ............. | 257/35 |
| 5,430,011 A | * | 7/1995 | Tanaka et al. | ............. | 257/15 |
| 5,504,058 A | * | 4/1996 | Tanaka et al. | ............. | 257/35 |
| 5,506,197 A | * | 4/1996 | Nakamura et al. | ............. | 257/34 |
| 5,591,696 A | * | 1/1997 | McDevitt et al. | ......... | 252/519.15 |
| 5,717,222 A | * | 2/1998 | Nakamura et al. | ............. | 257/36 |
| 5,998,050 A | * | 12/1999 | Yamada et al. | ............. | 428/700 |
| 6,251,530 B1 | * | 6/2001 | Bozovic et al. | ............. | 428/688 |

OTHER PUBLICATIONS

Keiichi Kimura et al., "Joining of $YBa_2Cu_3Ox$ with High Critical Current," *Proceedings of the 7th International Symposium on Superconductivitiy (ISS '94)*, Nov. 8–11, 1994, pp. 681–684.

K. Shimaoka et al., "Application of a Cryogenic Vector Network Measuring Technique in a High-speed Digital Test," *IEEE Transactions on Applied Superconductivity*, vol. 9, No. 2 (Jun. 1999), pp. 3845–3849.

Masaaki Maezawa et al., "Chip-to-Chip Communication Using a Single Flux Quantum Pulse," *IEEE Transactions on Applied Superconductivity*, vol. 10, No. 2 (Jun. 1999), pp. 1603–1604.

* cited by examiner

*Primary Examiner*—Tom Dunn
*Assistant Examiner*—Colleen P. Cooke
(74) *Attorney, Agent, or Firm*—Kolisch Hartwell, P.C.

(57) ABSTRACT

A superconducting laminated oxide substrate, which comprises a laminate a layer of a superconducting oxide crystal substrate made of a superconducting oxide single crystal or a superconducting oxide polycrystal and a layer of a reinforcing crystal substrate, prevents cracks from occurring in the superconducting oxide crystal substrate due to the heat treatment conducted for the purpose of forming an insulation film or a conductor film, and provides easy connectivity between electrodes and wiring formed on substrates located at upper and lower positions.

27 Claims, 8 Drawing Sheets

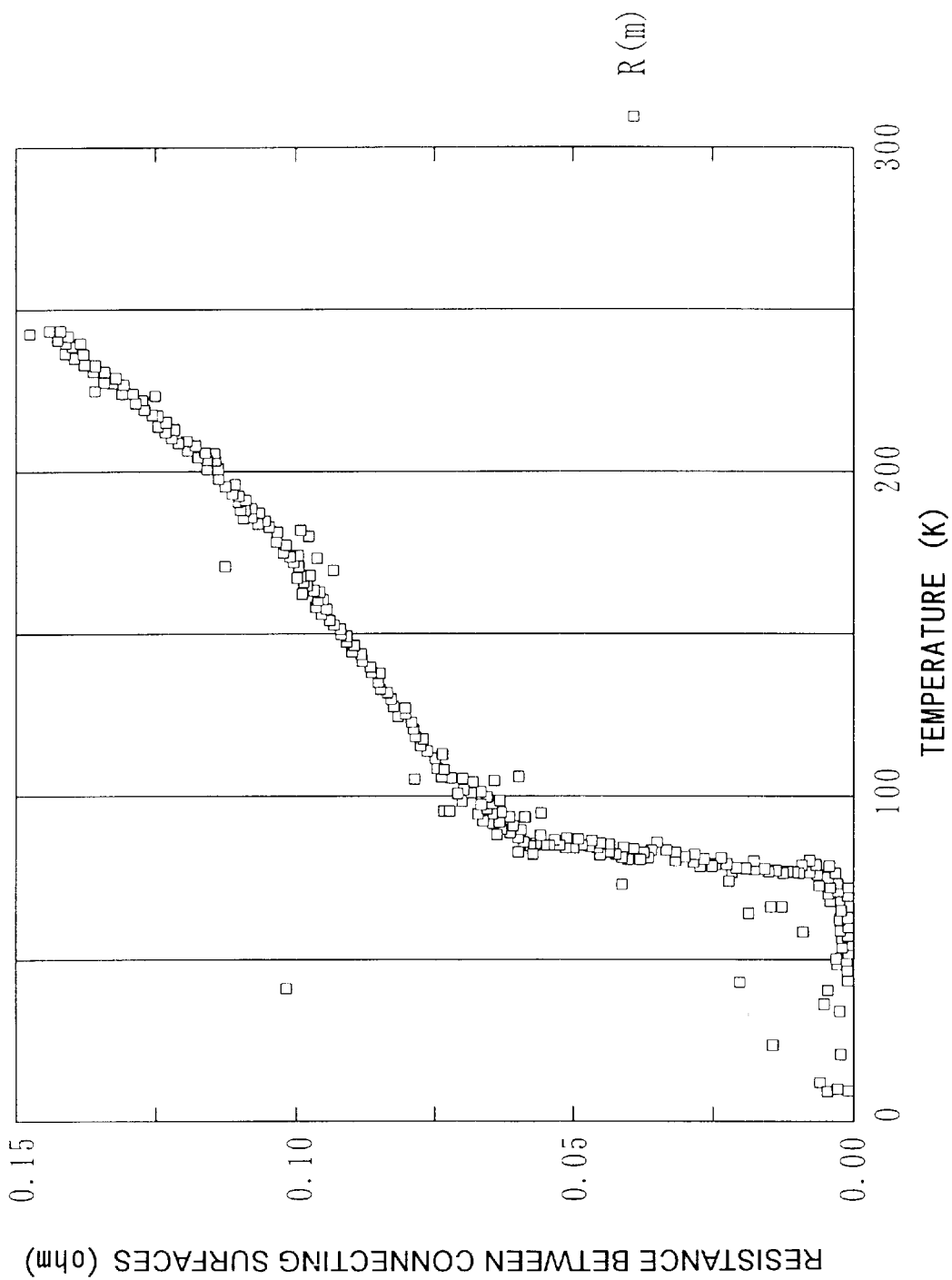

SUPERCONDUCTING LAMINATED OXIDE SUBSTRATE AND SUPERCONDUCTING INTEGRATED CIRCUIT

BACKGROUND OF THE INVENTION

1. Field of the Invention

The present invention relates to a superconducting laminated oxide substrate that can be used as the substrate of electronic devices such as superconducting devices, and a method of producing the same, and a method of producing a superconducting integrated circuit.

This application is based on Japanese Patent Applications (Japanese Patent Application No. Hei 11-252309 and Japanese Patent Application No. Hei 11-277616) filed in Japan, the contents of which are incorporated herein as a part of this specification.

2. Background Art

Use of a superconducting material generally makes it possible to decrease the high-frequency surface resistivity and operate a super conducting tunnel effect device at a high speed with lower power consumption. Thus attempts have been made to apply superconducting materials having such characteristics to electronic devices comprising high-frequency circuits. Super conducting electronic devices made of superconducting materials include superconducting integrated circuits. Superconducting integrated circuits are made by forming wiring consisting of a superconducting thin film via an insulation layer on a super conducting crystal substrate made of a superconducting oxide single crystal or a superconducting oxide polycrystal of Y—Ba—Cu—O.

With the method of the prior art, superconducting integrated circuits of the constitution described above have been made by a process in which a rod of the superconducting oxide single crystal or superconducting oxide polycrystal of Y—Ba—Cu—O is formed by a withdrawal method, and a superconducting oxide crystal substrate having a sheet shape, having a high degree of flatness, is made by slicing the rod and polishing, then forming an insulation film and a superconducting thin film on the superconducting oxide crystal substrate by a chemical vapor phase deposition process (CVD process), and forming the pattern of a superconducting circuit by photolithography process. The substrate is also heated as required, in order to improve the superconducting characteristics of the superconducting thin film that constitutes the superconducting circuit such as the critical current density.

The method of producing a superconducting integrated circuit of the prior art, however, involves heat treatment wherein the substrate is heated when forming the insulation film or the superconducting thin film for the circuit on the superconducting oxide crystal substrate, or heat treatment for heating the substrate to improve the superconducting characteristics. There has been the problem that thermal stress generated by the heat treatment, mechanical shock in a handling time, or the like, tends to cause defects such as cracks in the superconducting substrate resulting in a low production yield.

The problem described above becomes conspicuous particularly when producing superconducting integrated circuits of large sizes.

SUMMARY OF THE INVENTION

An object of the present invention is to achieve at least one of the goals of preventing cracks from occurring in the superconducting oxide crystal substrate due to the heat treatment conducted for the purpose of forming an insulation film or a conductor film on the superconducting oxide crystal substrate or a dielectric substrate that has a high degree of flatness and high degree of crystallinity and is used as the substrate of an electronic device whereon the insulation film and the conductive film to form a circuit are formed, and to provide easy connectivity between electrodes and wiring formed on substrates located at upper and lower positions.

In order to achieve the objects described above, the present invention provides a superconducting laminated oxide substrate comprising a laminate of a layer of a superconducting oxide crystal substrate made of a superconducting oxide single crystal or a superconducting oxide polycrystal, and a layer of a reinforcing crystal substrate.

The first aspect of the present invention employs a superconducting laminated oxide substrate formed by thermal compression bonding of the superconducting oxide crystal substrate consisting of a superconducting oxide single crystal or a superconducting oxide polycrystal and the reinforcing crystal substrate.

As a means of producing the superconducting laminated oxide substrate of the first aspect of the present invention, there is employed a method of producing a superconducting laminated oxide substrate, which comprises bringing a superconducting oxide crystal substrate made of a superconducting oxide single crystal or a superconducting oxide polycrystal into contact with a reinforcing crystal substrate and subjecting them to heat treatment, thereby bonding said superconducting oxide crystal substrate and said reinforcing crystal substrate on the interface thereof.

As a means of producing the superconducting laminated oxide substrate of the first aspect of the present invention, there is employed a method of producing a superconducting laminated oxide substrate, which comprises sandwiching a superconducting oxide crystal substrate made of a superconducting oxide single crystal or a superconducting oxide polycrystal by reinforcing crystal substrates on both sides thereof, subjecting to a heat treatment, thereby bonding the reinforcing crystal substrates onto both surfaces of the superconducting oxide crystal substrate, and slicing the superconducting oxide crystal substrate along a plane parallel to the surface.

In order to achieve the object described above, in the second aspect of the present invention, there may be employed a superconducting laminated oxide substrate according to claim 1, wherein the superconducting oxide crystal substrate made of the superconducting oxide single crystal or superconducting oxide polycrystal and the reinforcing crystal substrate are bonded by thermal compression.

As the method of producing the superconducting laminated oxide substrate of the second aspect of the present invention, there is employed a method of producing a superconducting laminated oxide substrate, which comprises bringing a superconducting oxide crystal substrate made of a superconducting oxide single crystal or a superconducting oxide polycrystal into contact with a superconducting thin oxide film of a reinforcing crystal substrate having the superconducting thin oxide film formed on the surface thereof and subjecting to a heat treatment, thereby bonding said superconducting oxide crystal substrate and said superconducting thin oxide film on the interface thereof.

In order to achieve the object described above, the third aspect of the present invention employs a superconducting laminated oxide substrate made by bonding the superconducting oxide crystal substrate consisting of a superconducting oxide single crystal or a superconducting oxide polycrystal and the reinforcing crystal substrate via an intermediate layer consisting of one or more layers, while at least the outermost layer of the intermediate layer is made of a low melting point material that melts at a temperature lower than the decomposition temperature of the superconducting oxide single crystal or the superconducting oxide polycrystal that constitutes the superconducting oxide crystal substrate.

As the method of producing the superconducting laminated oxide substrate of the third aspect of the present invention, there is employed a method of producing a superconducting laminated oxide substrate, which comprises disposing an intermediate layer having, at least in the outermost layer thereof, a low melting point layer that is made of a low melting-point material which melts at a temperature lower than the decomposition temperature of superconducting oxide single crystal or superconducting oxide polycrystal that constitutes a superconducting oxide crystal substrate between the superconducting oxide crystal substrate consisting of the superconducting oxide single crystal or the superconducting oxide polycrystal and a reinforcing crystal substrate, and applying a heat treatment to fuse the low melting point layer of said intermediate layer, thereby bonding said superconducting oxide crystal substrate and said reinforcing crystal substrate.

As the method of producing the superconducting laminated oxide substrate of the third aspect of the present invention, there may be employed a method of producing a superconducting laminated oxide substrate, which comprises applying a paste, that includes a material having melting point lower than the decomposition temperature of superconducting oxide single crystal or superconducting oxide polycrystal that constitutes a superconducting oxide crystal substrate as a major component, to at least one of the opposing surfaces of the superconducting oxide crystal substrate made of the superconducting oxide single crystal or the superconducting oxide polycrystal and a reinforcing crystal substrate, laminating said superconducting oxide crystal substrate on said reinforcing crystal substrate via the paste, and subjecting to a heat treatment, thereby to bond said superconducting oxide crystal substrate and said reinforcing crystal substrate.

Further, as the method of producing the superconducting laminated oxide substrate having any one of the constitutions described above, there may be employed a method of producing a superconducting laminated oxide substrate, which comprises applying a paste, that includes a low melting point material which melts at a temperature lower than the decomposition temperature of a superconducting oxide single crystal or a superconducting oxide polycrystal that constitutes a superconducting oxide crystal substrate as the major component, to both sides of said superconducting oxide crystal substrate made of the superconducting oxide single crystal or the superconducting oxide polycrystal by the withdrawal method, sandwiching said superconducting oxide crystal substrate by reinforcing crystal substrates via the paste on both sides thereof, subjecting to a heat treatment under a load, thereby bonding said reinforcing crystal substrates on both sides of said superconducting oxide crystal substrate, and slicing the superconducting oxide crystal substrate along a plane parallel to the surface thereof.

In the method of producing the superconducting integrated circuit according to the present invention, a thin dielectric film and a superconducting thin oxide film are formed on the superconducting laminated oxide substrate produced by the method of producing the superconducting laminated oxide substrate of one of the constitutions described above, and then the superconducting thin oxide film is patterned into wiring configuration, thereby forming the superconducting oxide wiring.

According to the method of producing the superconducting integrated circuit of the present invention, after forming the insulation film and the superconducting thin oxide film on at least one of the first and second superconducting laminated oxide substrates made by forming the superconducting oxide wiring from the superconducting oxide single crystal or the superconducting oxide polycrystal on the dielectric substrate, the superconducting thin oxide film is patterned into a wiring configuration to thereby form a superconducting oxide circuit, and then the superconducting oxide wiring of the first and second superconducting laminated oxide substrates are brought into contact directly with each other or via the superconducting thin oxide film and subjected to heat treatment, thereby bonding the superconducting oxide wiring of the first and second superconducting laminated oxide substrates with each other.

The superconducting thin oxide film, the superconducting oxide single crystal and the superconducting oxide polycrystal in the present invention refer not only to those having superconducting properties but also to those that develop superconducting properties when subjected to heat treatment.

Since the superconducting laminated oxide substrate of the present invention is, as a resulting of having the constitution described above, capable of improving the strength of the superconducting oxide crystal substrate that has a high degree of flatness and high crystallinity, the occurrence of cracks in the superconducting oxide crystal substrate can be greatly reduced and the production yield in the electronic device manufacturing process can be greatly improved even when heat treatment is applied when forming the insulation film and/or the conductor film on the laminated substrate.

Also because the superconducting oxide crystal substrate of the superconducting laminated oxide substrate has a high degree of flatness and high crystallinity, surface unevenness is unlikely to occur in the insulation film, wiring and electrodes that are formed on the superconducting oxide crystal substrate. Therefore, when two superconducting laminated oxide substrates whereon the insulation film, the wiring and the electrodes are formed are disposed to oppose each other and subjected to heat treatment, the electrodes and the wiring disposed at the upper position and lower position can be easily connected.

Also according to the method of producing the superconducting laminated oxide substrate of the present invention, the superconducting laminated oxide substrate of the present invention can be preferably obtained due to the constitution described above.

Also according to the method of producing the superconducting integrated circuit of the present invention, since the superconducting thin oxide film is patterned into the wiring configuration to form the superconducting oxide wiring after forming the thin dielectric film and the superconducting thin oxide film on the superconducting laminated oxide substrate produced by the method of the present invention, the occurrence of cracks in the superconducting oxide crystal substrate can be greatly reduced and the production yield in the electronic device manufacturing process can be greatly improved even when the heat treatment is applied when forming the insulation film and/or the conductor film.

Also according to the method of producing the superconducting integrated circuit of the present invention, the wiring of the first and second superconducting laminated oxide substrates can be easily connected, since the insulation film and the superconducting thin oxide film are formed on at least one of the first and second superconducting laminated oxide substrates made by forming the superconducting oxide wiring from superconducting oxide single crystal or superconducting oxide polycrystal on the dielectric substrate, the superconducting thin oxide film is patterned into a wiring configuration to thereby form the superconducting oxide circuit, and then the superconducting oxide wiring of the first and second superconducting laminated oxide substrates are brought into contact directly with each other or via the superconducting thin oxide film and subjected to heat treatment, thereby fusing the superconducting oxide wirings of the first and second superconducting laminated oxide substrates with each other.

BRIEF DESCRIPTION OF THE DRAWINGS

FIG. 11 is a graph showing the temperature dependency of the resistance between connecting surfaces of the superconducting integrated circuit of the example.

DESCRIPTION OF THE PREFERRED EMBODIMENTS

The superconducting laminated oxide substrate of the present invention and one embodiment of the method of producing the same will now be described below.

Figure 1:
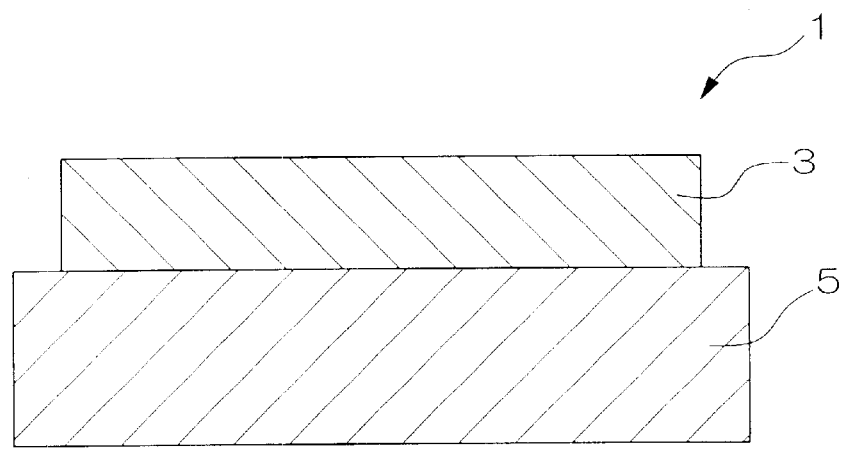
FIG. 1 is a sectional view showing the first embodiment of the superconducting laminated oxide substrate of the present invention.

FIG. 1 is a sectional view showing the first embodiment of the superconducting laminated oxide substrate of the present invention.

The superconducting laminated oxide substrate 1 is made by thermal-compression bonding of a superconducting oxide crystal substrate 3 and a reinforcing crystal substrate 5.

The superconducting oxide crystal substrate 3 is made of superconducting oxide single crystal or superconducting oxide polycrystal, the crystal being a superconducting oxide compound represented by the chemical formula (1).

$$R_{1+x}Ba_{2-x}Cu_3O_y \qquad (1)$$

where R is one or more element selected from among the group of Y, Nd, Sm, Gd, Eu, Yb and Pr, y is in the range from 6 to 7, and x is in a range from 0 to 1.

The material that constitutes the reinforcing crystal substrate 5 is preferably a dielectric material that has a melting point higher than the melting point Mp (peritectic temperature Tp) of the superconducting oxide single crystal or the superconducting oxide polycrystal that constitutes the superconducting oxide crystal substrate 3 and has a strength higher than that of the superconducting oxide crystal substrate 3 and, for example, MgO, SrTiO$_3$ and Yttrium-stabilized zirconia (YSZ) are used. Among these materials, MgO single crystal that has a thermal expansion coefficient larger than that of the superconducting oxide crystal substrate 3 is preferably used.

Now the first method of producing the superconducting laminated oxide substrate 1 of the first embodiment will be described below with reference to FIG. 2 through FIG. 4.

First, a rod of the superconducting oxide single crystal or the superconducting oxide polycrystal of the composition described above is prepared according to a solution withdrawal method, a solution stationary cooling method (flux method), or a traveling solvent floating zone method (TSFZ method). Among them, a solution withdrawal method can be preferably used.

In the solution stationary cooling method, the desired solid phase is dissolved in the appropriate solvent, the solution is cooled gently and slowly, and then a crystal crystallizes out due to a change in solubility due to temperature.

In the solution withdrawal method, a crystal starts to grow selectively from a seed crystal in contact with the surface of the solution, and the crystal keeps growing continuously during upward withdrawal. Specifically, the solution withdrawal method can be conducted as follows.

A Y211 crystal phase is used as a Y-solution providing material, and BaO—CuO oxide having a composition of 37.5BaO-62.5CuO as a solvent material with regard to a Y123 crystal phase. These materials can be obtained by weighing out 99.9% pure Y$_2$O$_3$, BaO, and CuO so as to make up a predetermined composition, mixing in a ball mill, and baking in an atmosphere at about 880° C. for about 20 hours. An yttrialite crucible having an inside diameter of about 50 mm and a depth of about 45 mm is filled with 38 g of the Y211 crystal phase and 295 g of solvent. The crucible is heated up to 1000° C. or more in a furnace. After the solvent is completely melted, the solution is separated into two layers, the upper layer being a solution in a liquid phase, and the lower layer being a precipitation layer of the Y211 crystal phase. Then, the temperature of the surface of the solution is raised to 1000° C., and the temperature of the precipitation phase is raised to 1010–1015° C. A Y123 single crystal which has been grown in advance is used as a seed crystal for starting crystal growth. Generally, when the crystal grows, a rotary speed thereof is about 120 revolutions per minute, and a withdrawal speed is about 0.1 mm/h. Thereby, a crystal having a size of more than 1 cm$^3$ can be produced.

After a rod is produced, it is sliced to make a superconducting oxide crystal substrate 3a in the form of sheet. The superconducting oxide crystal substrate 3a in the form of sheet is made rather thick for the purpose of dividing it into two sheets in a process to be described later and, in this embodiment, the thickness is not less than twice the thickness of the superconducting oxide crystal substrate 3. The rod made of the superconducting oxide polycrystal may also be produced by a method other than the withdrawal method.

Of the surfaces of superconducting oxide crystal substrate 3a made in the form of sheet as described above, the surface that is bonded with the reinforcing crystal substrate 5 is preferably subjected to rough polishing to make the surface roughness in a range from 0.01 μm to 50 μm, because bonding with the reinforcing crystal substrate 5 can be improved and the surface flatness of the superconducting oxide crystal substrate 3 of the superconducting laminated oxide substrate 1 can be improved by this polishing. Of the surfaces of the superconducting oxide crystal substrate 3a having the form of sheet, the surface whereon the wiring and the insulation film are formed is preferably subjected to fine polishing since this improves the surface flatness.

The rod is preferably sliced so that the cleavage plane of the superconducting oxide single crystal or the superconducting oxide polycrystal becomes the surface of the substrate 3, because bonding with the reinforcing crystal substrate 5 can be improved and a superconducting oxide crystal substrate 3 of better surface flatness can be obtained.

Then the superconducting oxide crystal substrate 3a is interposed by the reinforcing crystal substrates 5, 5 on both sides thereof, thereby forming a laminate 25. The surface of each of the reinforcing crystal substrates 5 is preferably polished to control the surface roughness in a range from 0.01 μm to 50 μm, because this improves the bonding with the superconducting oxide crystal substrate 3a.

Then heat treatment is applied to the laminate 25 under a load. For the heat treatment, the heating furnace 20 shown in FIG. 2 is used. The heating furnace 20 consists mainly of a processing vessel 21 made of alumina, a heater 22 for heating the processing vessel from the outside thereof and a thermocouple 23 for measuring the temperature in the processing vessel 21.

When applying the heat treatment to the laminate 25 under a load using the heating furnace 20 of the constitution described above, the laminate 25 made as described above is put into the processing vessel 21 and a weight 30 is placed on the laminate 25. Then after raising the temperature from the room temperature to the heat treatment temperature by the heater 22 and maintaining the heat treatment temperature for a predetermined period of time (heat treatment time), the temperature is lowered to room temperature. FIG. 3 shows the pattern of the heating cycle in the heat treatment of the laminate 25, where time is plotted along abscissa and temperature is plotted along ordinate. In FIG. 3, solid line (1) shows the change of temperature in the processing vessel 21, that can be measured with the thermocouple 23. Dashed line (2) shows the melting point Mp (or peritectic temperature Tp) of the superconducting oxide single crystal or the superconducting oxide polycrystal that constitutes the superconducting oxide crystal substrate 3a minus 100° C. (Mp −100). Dashed line (3) shows the melting point Mp (peritectic temperature Tp) of the superconducting oxide single crystal or the superconducting oxide polycrystal that constitutes the superconducting oxide crystal substrate 3a. Dashed line (4) shows the melting point of the material that constitutes the reinforcing crystal substrate.

Dashed line (2) may also be the decomposing temperature of the superconducting oxide single crystal or the superconducting oxide polycrystal that constitutes the superconducting oxide crystal substrate 3a minus 100° C., and dashed line (3) may also be the decomposing temperature of the superconducting oxide single crystal or the superconducting oxide polycrystal that constitutes the superconducting oxide crystal substrate 3a.

The load applied during the heat treatment process is preferably in a range from 5 to 1000 g/cm$^2$. A load less than 5 g/cm$^2$ leads to insufficient bonding force and is not desirable, and a load greater than 1000 g/cm$^2$ may cause cracks and other defects and is therefore not desirable.

The heat treatment temperature is preferably lower than the melting point Mp (or peritectic temperature Tp) of the superconducting oxide single crystal or the superconducting oxide polycrystal that constitutes the superconducting oxide crystal substrate 3a, and higher than the temperature Mp−100 (K). A heat treatment temperature higher than the melting point Mp causes the superconducting oxide to melt and is therefore not desirable, and a heat treatment temperature lower than the temperature Mp−100 (K) leads to insufficient bonding force, and is therefore not desirable.

The heat treatment temperature may also be set within a range lower than the decomposition temperature of the superconducting oxide single crystal or the superconducting oxide polycrystal that constitutes the superconducting oxide crystal substrate 3a, and higher than the decomposition temperature minus 100 (K).

The heating rate to attain the heat treatment temperature is preferably in a range from 1 to 500 K/hour, and more preferably in a range from 10 to 50 K/hour. A heating rate lower than 1 K/hour makes the creation of twins conspicuous in an oxygen atmosphere while making the processing time longer, and is therefore not desirable. A heating rate higher than 500 K/hour increases the thermal stress that increases the possibility of occurrence of cracks, and is therefore not desirable.

The heat treatment time is preferably in a range from 1 to 300 hours, and more preferably in a range from 10 to 150 hours. Heat treatment time less than 1 hour is not desirable because sufficient fusing cannot be achieved, while heat treatment time longer than 300 hours is unpractically long and is not desirable.

The cooling rate for lowering the temperature from the heat treatment temperature is preferably in a range from 1 to 500 K/hour, and more preferably in a range from 10 to 50 K/hour. A cooling rate lower than 1 K/hour makes the processing time too long and makes the creation of twins conspicuous, and is therefore not desirable. A cooling rate higher than 500 K/hour increases the thermal stress including the stress due to the difference in thermal expansion coefficients that increases the possibility of occurrence of cracks, and is therefore not desirable.

The heat treatment described above may be carried out in an air atmosphere, although it is preferably carried out in a low-oxygen atmosphere since this makes it possible to lower the melting point Mp (or peritectic temperature Tp) or the decomposition temperature of the superconducting oxide single crystal or the superconducting oxide polycrystal and, as a result, to lower the heat treatment temperature.

When the laminate 25 is subjected to heat treatment under a load as described above, the reinforcing crystal substrates 5, 5 can be fastened onto both sides of the superconducting oxide crystal substrate 3a. This is because, when the laminate 25 is subjected to heat treatment under a load, air that has been trapped in the space between the particles of the superconducting oxide crystal substrate 3a and the particles of the reinforcing crystal substrates 5 in the interface thereof is activated and moves, so that intermolecular forces can work between the molecules of the particles of the superconducting oxide crystal substrate 3a and the molecules of the particles of the reinforcing crystal substrates 5 thereby to bond the superconducting oxide crystal substrate 3a and the reinforcing crystal substrates 5, 5.

Figure 4:
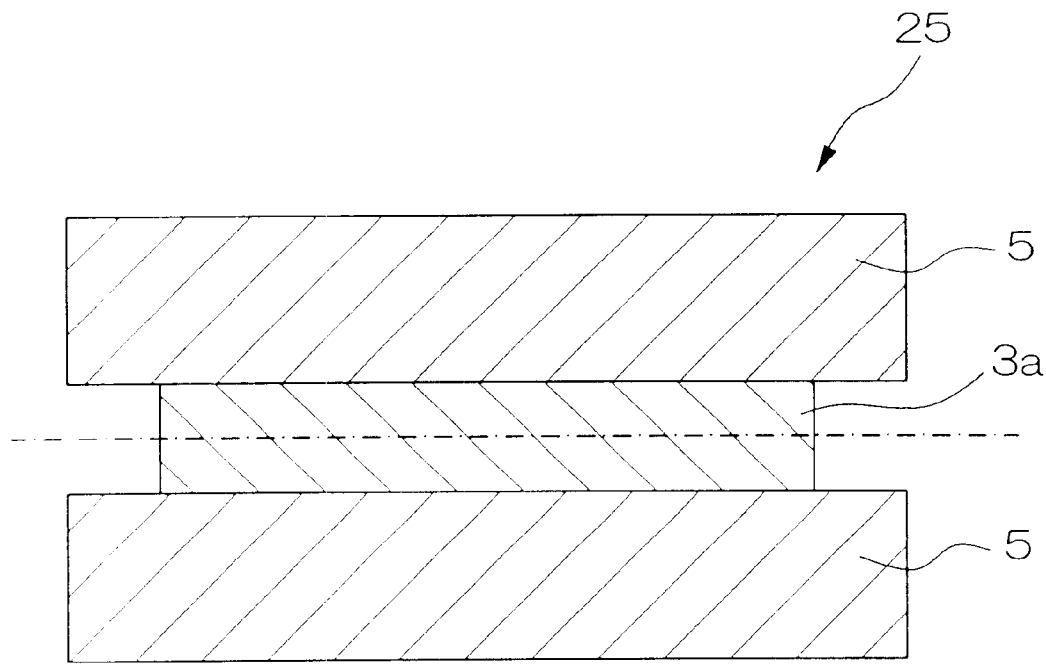
FIG. 4 is a drawing for explaining the method of producing the superconducting laminated oxide substrate according to the first embodiment of the present invention.

Then the laminate 25 is taken out of the processing vessel 21 and the superconducting oxide crystal substrate 3a of the laminate 25 is sliced along a plane parallel to the surface as shown in FIG. 4, so that two sheets of the superconducting laminated oxide substrate 1 are obtained at once. The superconducting oxide crystal substrate 3a is preferably sliced so that the cleavage plane of the superconducting oxide single crystal or the superconducting oxide polycrystal becomes the surface of the superconducting oxide crystal substrate 3 of the laminated substrate 1, in order to achieve better surface flatness.

It is also preferable to apply fine polishing, as required, to the surface of the superconducting oxide crystal substrate 3 of the superconducting laminated oxide substrate 1 that is obtained as described above, in order to achieve better surface flatness.

If the superconducting oxide crystal substrate 3 of the superconducting laminated oxide substrate 1 obtained as described above has insufficient superconducting characteristics, the substrate 1 is annealed by heating to a temperature of 500° C. to 600° C. in an oxygen atmosphere. The annealing process may also be carried out when lowering the temperature in the heat treatment process for bonding the superconducting oxide crystal substrate 3 and the reinforcing crystal substrate 5.

Although the embodiment described above is a case where the heat treatment for bonding the superconducting oxide crystal substrate 3a and the reinforcing crystal substrate 5 is carried out under a load, the substrates can also be bonded by only their own weight, without an external load, by raising the heat treatment temperature within the range described previously.

Now, the second method of producing the superconducting laminated oxide substrate 1 of the first embodiment will be described below.

The reinforcing crystal substrate 5 is laminated on one side of the superconducting oxide crystal substrate 3a that has been made similarly to the first method, and the laminate is subjected to heat treatment similarly to the first method, thereby bonding the superconducting oxide crystal substrate 3a and the reinforcing crystal substrate 5 on the interface thereof, so that the superconducting laminated oxide substrate 1 as shown in FIG. 1 is obtained. Since this second method does not require the process of slicing the superconducting oxide crystal substrate 3a in a plane parallel to the surface, a substrate 3a having a thickness smaller than that used in the first method is used.

Since the superconducting laminated oxide substrate 1 of the first embodiment is made by thermal compression bonding of a superconducting oxide crystal substrate 3 that has a high degree of flatness and high crystallinity and a reinforcing crystal substrate 5 that has high strength, the strength of the superconducting oxide crystal substrate 3 can be improved. Also the occurrence of cracks in the superconducting oxide crystal substrate can be greatly reduced and the production yield in the electronic device manufacturing process can be greatly improved even when heat treatment is applied when forming the insulation film and/or the conductor film on the laminated substrate 1.

Also because the superconducting oxide crystal substrate 3 of the superconducting laminated oxide substrate 1 has a high degree of flatness and high crystallinity, surface unevenness is less likely to occur in the insulation film, the superconducting wiring and the electrodes that are formed on the superconducting oxide crystal substrate 3. As a consequence, when two sheets of the superconducting oxide crystal substrate, whereon the insulation film, the superconducting wiring and the electrodes are formed, are disposed to oppose each other and subjected to heat treatment, the electrodes and the wiring located at the upper and lower positions can be easily connected.

While the embodiment described above is a case in which the substrate 3 made of the superconducting oxide single crystal or the superconducting oxide polycrystal is fabricated by the withdrawal method, the substrate may be made by other methods as long as a substrate of the superconducting oxide single crystal or the superconducting oxide polycrystal having a certain minimum thickness can be made.

Also, the case of placing the weight 30 on the laminate 25 as a load during the heat treatment for bonding the superconducting oxide crystal substrate 3 and the reinforcing crystal substrate 5 by thermal compression bonding has been described above, although the heat treatment may be carried out while pressurizing the laminate 25 on both sides thereof by means of springs made of stainless steel or the like.

Now the second embodiment of the superconducting laminated oxide substrate of the present invention will be described below.

Figure 5:
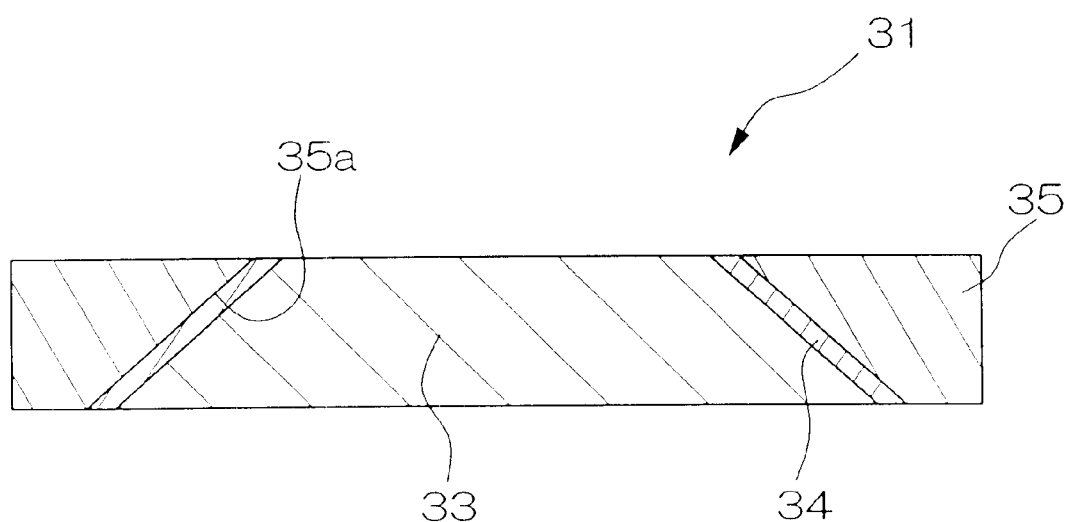
FIG. 5 is a sectional view showing the second embodiment of the superconducting laminated oxide substrate of the present invention.

FIG. 5 is a sectional view showing the superconducting laminated oxide substrate of the second embodiment.

The superconducting laminated oxide substrate 31 comprises a superconducting oxide crystal substrate 33 made of a superconducting oxide single crystal or a superconducting oxide polycrystal and a reinforcing crystal substrate (thin dielectric sheet) 35 that has a superconducting thin oxide film 34 formed on the surface thereof, wherein the superconducting thin oxide film 34 and the superconducting oxide crystal substrate 33 are bonded by thermal compression.

The superconducting oxide crystal substrate 33 is different from the superconducting oxide crystal substrate 3 used in the first embodiment in that part of the superconducting oxide crystal substrate made in the sheet shape by the withdrawal method is removed to obtain a cross section of trapezoidal shape. While the surface of the substrate 33 may be a plane of any orientation, it is most preferable to take the c plane that minimizes the intrusion distance of magnetic field, in order to decrease the inductance of the wiring.

The reinforcing crystal substrate 35 is different from the reinforcing crystal substrate 5 used in the first embodiment in that a fitting hole 35a is formed for fitting the superconducting oxide crystal substrate 33. The fitting hole 35a is formed in such a configuration that the diameter increases from the top towards the bottom. A superconducting thin oxide film 34 is formed on the surface of the fitting hole 35a.

The superconducting oxide crystal substrate 33 is fitted in the fitting hole 35a of the reinforcing crystal substrate 35 where the superconducting thin oxide film 34 is formed, and bonded therein by thermal compression.

Now the method of producing the superconducting laminated oxide substrate 31 of the second embodiment will be described below.

First, a superconducting oxide crystal substrate made in a sheet shape similarly to the method described previously is cut to have a cross section of a trapezoidal shape by a mechanical machining process using ultrasound, laser, a lathe or other means, or a chemical etching process such as dry etching or wet etching, thereby making the superconducting oxide crystal substrate 33.

Then the reinforcing substrate 35 having the fitting hole 35a formed therein by machining for receiving the superconducting oxide crystal substrate 33 fitted therein is prepared, and the superconducting thin oxide film 34 made of the superconducting oxide polycrystal is formed on the surface of the fitting hole 35a by such a process as vapor phase deposition.

Then after fitting the superconducting oxide crystal substrate 33 in the fitting hole 35a of the reinforcing substrate 35, heat treatment is applied similarly to the method of producing the superconducting laminated oxide substrate of the first embodiment, so that the superconducting oxide crystal substrate 33 and the superconducting thin oxide film 34 are bonded to each other by sintering, to thereby obtain the superconducting laminated oxide substrate 31 as shown in FIG. 5. The surface of the superconducting laminated oxide substrate 31 thus obtained is preferably polished to be flat similarly to the method described previously.

Since the superconducting laminated oxide substrate 31 of the second embodiment is made by thermal compression bonding of a superconducting oxide crystal substrate 33 that has a high degree of flatness and high crystallinity and a superconducting thin oxide film 34 formed on the reinforcing crystal substrate 35 that has high strength, the strength of the superconducting oxide crystal substrate 33 can be improved. Also the occurrence of cracks in the superconducting oxide crystal substrate 33 can be greatly reduced and the production yield in the electronic device manufacturing process can be greatly improved even when heat treatment is applied when forming the insulation film and/or the conductor film on the laminated substrate 31.

While the superconducting oxide crystal substrate 3 is made of superconducting oxide single crystal or superconducting oxide polycrystal based on R—Ba—Cu—O (R is one or more element selected from among a group of Y, Nd, Sm, Gd, Eu, Yb and Pr) in the first and second embodiments, the present invention may be applied also to a case where the substrate 3 is made of a superconducting oxide single crystal or polycrystal based on A—B—Cu—O (A is one or more selected from among group IIIa elements such as La, Ce, Y, Sc and Yb, and B is one or more selected from among group IIa elements such as Sr and Br).

Figure 6:
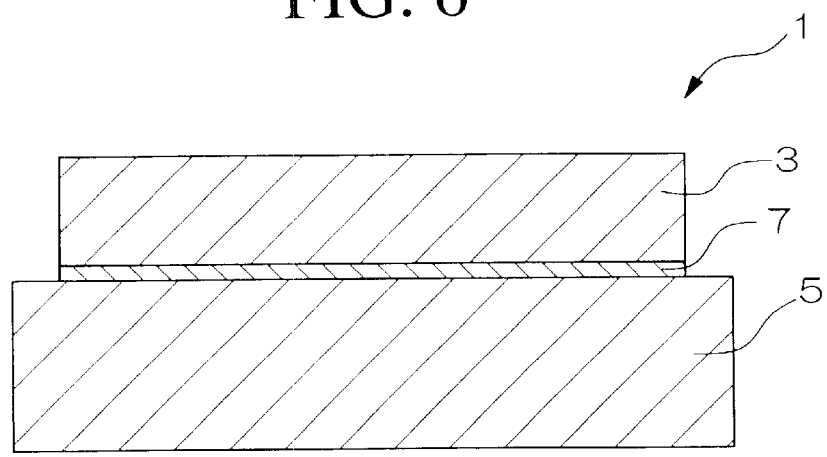
FIG. 6 is a sectional view showing an embodiment of the superconducting laminated oxide substrate of the present invention.

FIG. 6 is a sectional view showing the third embodiment of the superconducting laminated oxide substrate of the present invention.

The superconducting laminated oxide substrate 11 is made by bonding the superconducting oxide crystal substrate 3 and the reinforcing crystal substrate 5 via an intermediate layer 7 that consists of one or more layer.

The superconducting oxide crystal substrate 3 and the reinforcing crystal substrate 5 are made of a material similar to that of the superconducting oxide crystal substrate 3 or the reinforcing crystal substrate 5 of the first embodiment, respectively.

The intermediate layer 7 has, at least on the outermost layer thereof, a low-melting point layer made of a material having a melting point lower than the decomposition temperature or the melting point (peritectic temperature Tp) of the superconducting oxide single crystal or the superconducting oxide polycrystal that constitutes the superconducting oxide crystal substrate 3.

For the low melting point material that makes the low melting point layer, a superconducting oxide powder that has a decomposition temperature lower than the decomposition temperature or the melting point (peritectic temperature Tp) of the superconducting oxide single crystal or the superconducting oxide polycrystal that constitutes the superconducting oxide crystal substrate 3 is used. Specifically, for the low melting point material, $YbBa_2Cu_3O_y$ having a decomposition temperature of 875° C. is used when the superconducting oxide crystal substrate 3 is made of $YBa_2Cu_3O_y$ having a decomposition temperature of 1010° C., $YBa_2Cu_3O_y$ (Y123) or $YbBa_2Cu_3O_y$ (Yb123) having a sufficiently low decomposition temperature is used when the superconducting oxide crystal substrate 3 is made of $SmBa_2Cu_3O_y$ having a decomposition temperature of 1060° C., and $YBa_2Cu_3O_y$ (Y123), $YbBa_2Cu_3O_y$ (Yb123) or $SmBa_2Cu_3O_y$ (Sm123) having a sufficiently low decomposition temperature is used when the superconducting oxide crystal substrate 3 is made of $NdBa_2Cu_3O_y$ having a decomposition temperature of 1090° C.

Figure 7:
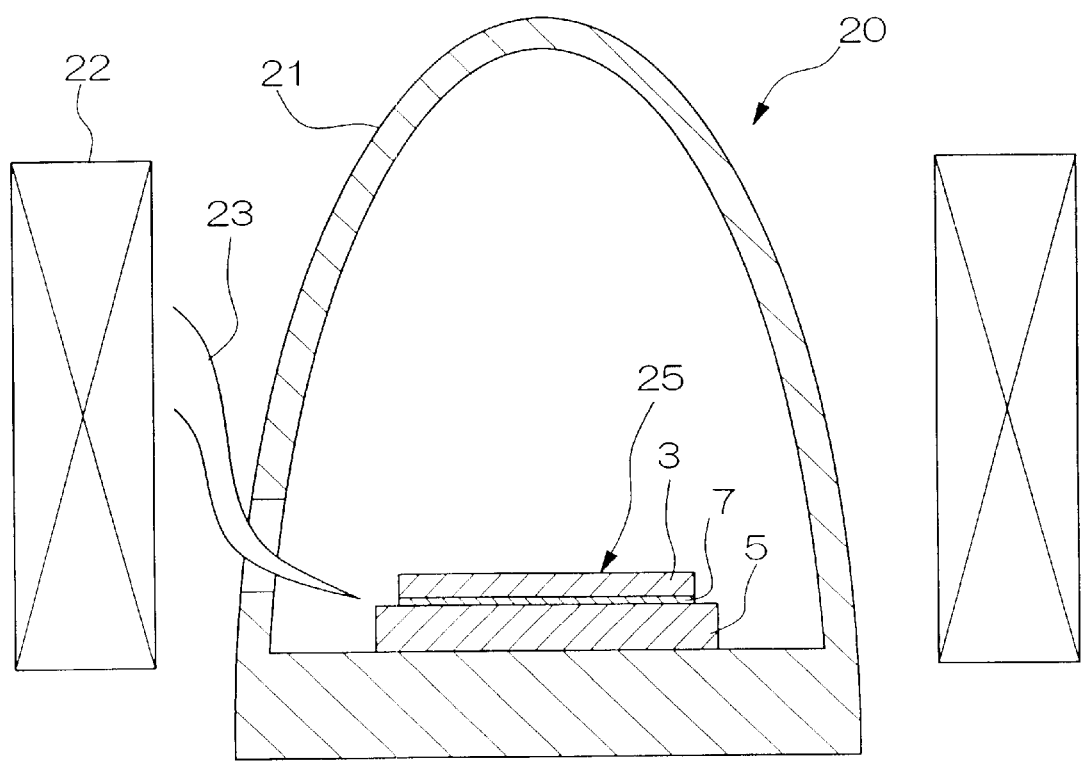
FIG. 7 is drawing schematically showing the constitution of a heating furnace preferably used in the embodiment of the method of producing the superconducting laminated oxide substrate of the present invention.

Now the first method of producing the superconducting laminated oxide substrate 11 of the third embodiment will be described below with reference to FIG. 2 and FIG. 7.

First, after a rod of the superconducting oxide single crystal or the superconducting oxide polycrystal is made by the withdrawal method, the rod is sliced and polished with a lapping film or the like as required, thereby to produce a superconducting oxide crystal substrate 3 in the form of a sheet. The rod is preferably sliced so that the cleavage plane of the superconducting oxide single crystal or the superconducting oxide polycrystal becomes the surface of the substrate 3.

A laminate is made by interposing an intermediate layer 7 that has, at least in the outermost layer thereof, a low melting point layer made of a material having melting point lower than the decomposition temperature of the superconducting oxide single crystal or the superconducting oxide polycrystal that constitutes the superconducting oxide crystal substrate 3, between the superconducting oxide crystal substrate 3 and the reinforcing crystal substrate 5.

Then heat treatment is applied to the laminate. For the heat treatment, a heating furnace 20 as shown in FIG. 7 is used. The heating furnace 20 consists mainly of a processing vessel 21 made of alumina, a heater 22 for heating the processing vessel from the outside thereof and a thermocouple 23 for measuring the temperature in the processing vessel 21.

When applying the heat treatment to the laminate using the heating furnace 20 of the constitution described above, the laminate 25 made as described above is put into the processing vessel 21 and the temperature is raised from room temperature to the heat treatment temperature by the heater 22. After maintaining the heat treatment temperature for a predetermined period of time (heat treatment time), the temperature is lowered to room temperature. The pattern of the heating cycle in the heat treatment of the laminate will be described below with reference to FIG. 2. Solid line (1) shows the change of temperature in the processing vessel 21, that can be measured with the thermocouple 23. Dashed line (2) shows the melting point or the decomposition temperature of the low melting point material that constitutes the low melting point layer of the intermediate layer 7. Dashed line (3) shows the decomposition temperature of the superconducting oxide single crystal or the superconducting oxide polycrystal that constitutes the superconducting oxide crystal substrate 3. Dashed line (4) shows the melting point of the material that constitutes the reinforcing crystal substrate.

The heat treatment temperature is set in a range lower than the decomposition temperature of the superconducting oxide single crystal or the superconducting oxide polycrystal that constitutes the superconducting oxide crystal substrate 3, and higher than the melting point or the decomposition temperature of the low melting point material that constitutes the low melting point layer of the intermediate layer 7.

The heating rate to attain the heat treatment temperature is preferably in a range from 10 to 500 K/hour, and more preferably in a range from 20 to 150 K/hour. A heating rate lower than 10 K/hour makes the creation of twins conspicuous in an oxygen atmosphere while making the processing time longer, and is therefore not desirable. A heating rate higher than 500 K/hour increases thermal stress, which increases the possibility of occurrence of cracks, and is therefore not desirable.

The heat treatment time is preferably in a range from 1 to 300 hours, and more preferably in a range from 10 to 150 hours. A heat treatment time less than 1 hour is not desirable because sufficient fusing cannot be achieved, and a heat treatment time longer than 300 hours is unpractically long and is not desirable.

The cooling rate for lowering the temperature from the heat treatment temperature is preferably in a range from 1 to 500 K/hour, and more preferably in a range from 10 to 50 K/hour. A cooling rate lower than 1 K/hour makes the processing time too long and makes the creation of twins conspicuous, and is therefore not desirable. A cooling rate higher than 500 K/hour increases thermal stress, including the stress due to differences in thermal expansion coefficient, which increases the possibility of occurrence of cracks, and is therefore not desirable.

The heat treatment as described above may be carried out in an air atmosphere, although it is preferably carried out in a low-oxygen atmosphere since this makes it possible to lower the melting point or the decomposition temperature of the low melting point material that constitutes the low melting point layer and accordingly to lower the heat treatment temperature.

When the laminate 25 is subjected to heat treatment as described above, the low melting point layer of the intermediate layer 7 disposed between the superconducting oxide crystal substrate 3 and the reinforcing crystal substrate 5 is fused. Thus as the superconducting oxide crystal substrate 3 and the reinforcing crystal substrate 5 are bonded together, the superconducting laminated oxide substrate 1 as shown in FIG. 6 is obtained.

If the superconducting oxide crystal substrate 3 of the superconducting laminated oxide substrate 1 that is obtained as described above has insufficient superconducting characteristics, the substrate 1 is annealed by heating to a temperature in a range from 500°C. to 600° C. in an oxygen atmosphere. The annealing process may be carried out when lowering the temperature during the heat treatment process for bonding the superconducting oxide crystal substrate 3 and the reinforcing crystal substrate 5.

Now the second method of producing the superconducting laminated oxide substrate 11 of the third embodiment will be described below.

A paste which includes a material having melting point lower than the decomposition temperature of the superconducting oxide single crystal or the superconducting oxide polycrystal that constitutes the superconducting oxide crystal substrate 3 as a major component, is applied by spraying or another method to at least one of the opposing surfaces of the superconducting oxide crystal substrate 3 made similarly to the first method and the reinforcing crystal substrate 5.

For the low melting point material included in the paste, a superconducting oxide powder that has a decomposition temperature lower than the decomposition temperature of the superconducting oxide single crystal or the superconducting oxide polycrystal that constitutes the superconducting oxide crystal substrate 3 is used. The paste also includes ethyl acetate in addition to the superconducting oxide powder of low melting point. The quantity of the paste to be applied is preferably in a range from 0.1 to 1 $g/cm^2$.

Then after laminating the superconducting oxide crystal substrate 3 on the reinforcing crystal substrate 5 via the paste, a heat treatment similar to that of the first method is applied to bond the superconducting oxide crystal substrate 3 and the reinforcing crystal substrate 5, thereby to obtain the superconducting laminated oxide substrate 11 shown in FIG. 6.

Since the superconducting laminated oxide substrate 11 of the third embodiment is made by bonding the superconducting oxide crystal substrate 3 that has a high degree of flatness and high crystallinity and the reinforcing crystal substrate 5 of high strength via the intermediate layer 7 that has, at least in the outermost layer thereof, a low melting point layer made of a material having a melting point lower than the decomposition temperature of the superconducting oxide single crystal or the superconducting oxide polycrystal that constitutes the superconducting oxide crystal substrate 3, interposed between the superconducting oxide crystal substrate 3 and the reinforcing crystal substrate 5, the strength of the superconducting oxide crystal substrate 3 can be improved. Also the occurrence of cracks in the superconducting oxide crystal substrate 3 can be greatly reduced and the production yield in the electronic device manufacturing process can be greatly improved even when heat treatment is applied when forming the insulation film and/or the conductor film on the laminated substrate.

While the embodiment described above is a case in which the substrate 3 made of the superconducting oxide polycrystal is made by the withdrawal method, the substrate may be made by another method as long as a substrate having a certain minimum thickness can be made.

Also in the embodiment described above, the reinforcing crystal substrate 5 is bonded to one side of the superconducting oxide crystal substrate 3, although the reinforcing crystal substrates 5, 5maybe bonded to both sides of the superconducting oxide crystal substrate 3. The superconducting laminated oxide substrate of such a constitution may also be produced by the method described below.

A paste similar to that used in the second method is applied to both sides of the superconducting oxide crystal substrate 3 made of the superconducting oxide single crystal or the superconducting oxide polycrystal by the withdrawal method. It is desirable to use a superconducting oxide crystal substrate 3 that is thicker than that used in the first and second methods.

Then after sandwiching the superconducting oxide crystal substrate 3 with two reinforcing crystal substrates 5 via the paste, heat treatment is applied under a load, similarly to the first method, and the reinforcing crystal substrates 5 can be bonded to both sides of the superconducting oxide crystal substrate 3. The superconducting oxide crystal substrate 3 is then sliced along a plane parallel to the surface, so that two sheets of the superconducting laminated oxide substrate are obtained at once. The superconducting oxide crystal substrate 3 is preferably sliced so that the cleavage plane of the superconducting oxide single crystal or the superconducting oxide polycrystal becomes the surface of the superconducting oxide crystal substrate 3. The surface of the superconducting oxide crystal substrate of the superconducting laminated oxide substrate that is obtained as described above is polished as required While the superconducting oxide crystal substrate 3 is made of superconducting oxide single crystal or superconducting oxide polycrystal based on R—Ba—Cu—O (R is one or more element selected from among a group of Y, Nd, Sm, Gd, Eu, Yb and Pr) in the embodiments described above, the present invention may also be applied to a case where the substrate 3 is made of a superconducting oxide single crystal or polycrystal based on A—B—Cu—O (A is one or more selected from among group IIIa elements such as La, Ce, Y, Sc and Yb, and B is one or more selected from among group IIa elements such as Sr and Br).

Now the method of producing the superconducting integrated circuit of the present invention will be described below.

Figure 8A:
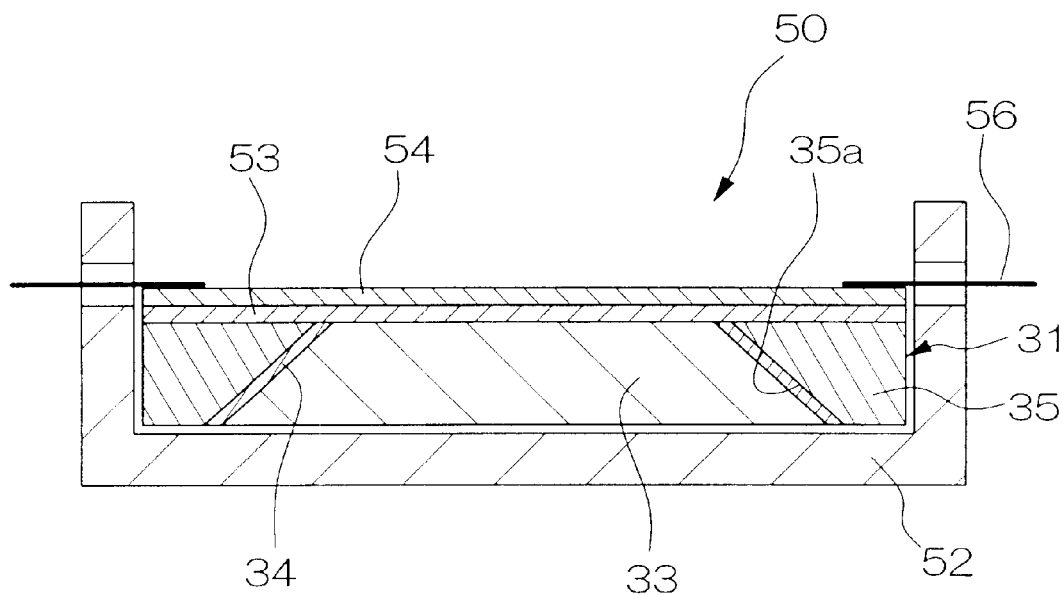
FIGS. 8A and 8B show a superconducting integrated circuit produced by an embodiment of the method of producing the superconducting integrated circuit according to the present invention, with FIG. 8A being a side view and FIG. 8B being a top view thereof.
Figure 8B:
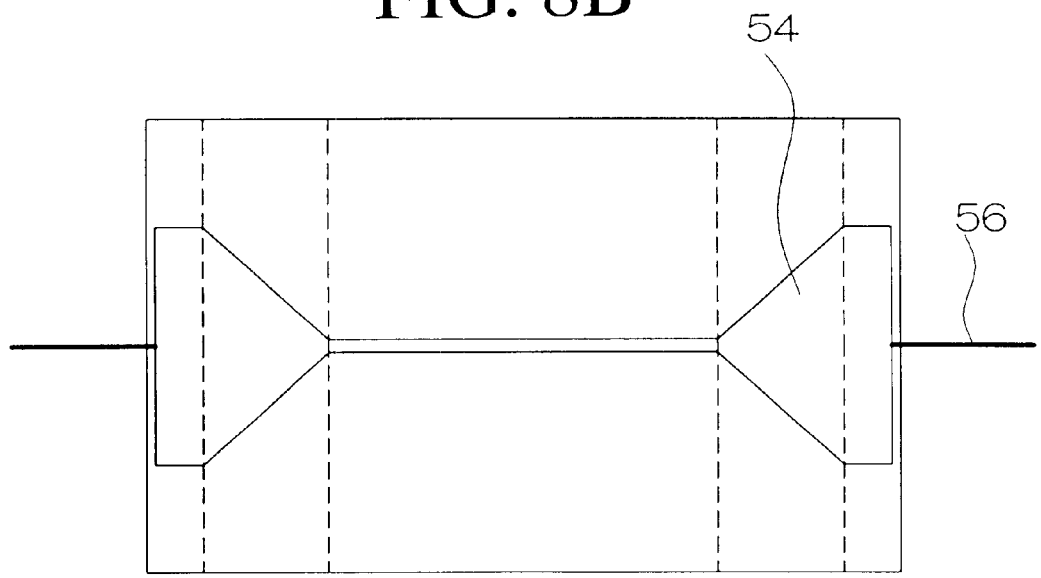

FIGS. 8A and 8B show the superconducting integrated circuit produced by the first embodiment of the method of producing the superconducting integrated circuit according to the present invention, with FIG. 8A being a side view and FIG. 8B being a top view thereof.

The superconducting integrated circuit 50 is made by housing the superconducting laminated oxide substrate 31 of the second embodiment shown in FIG. 5 in a cavity 52 made of copper, thereby forming a thin dielectric film 53 made of MgO or the like on the laminated substrate 31, forming a superconducting oxide wiring 54 made of $YBa_2Cu_3O_y$ or the like on the thin dielectric film 53, and connecting a center conductor 56 to the wiring 54.

Inclined portions of the reinforcing crystal substrate 35 are made in a tapered configuration so that the width of the wiring changes with the position. Since the characteristic impedance of a superconducting microstrip wiring line is determined by the ratio of the thickness of the dielectric material and the wiring pattern, impedance is matched by making the wiring 54 thicker in a portion located on the reinforcing crystal substrate 35 made of a dielectric material and making the wiring 54 thinner in a portion at places other than on the reinforcing crystal substrate 35, namely on the superconducting oxide crystal substrate 33. This configuration makes it possible to connect an external connector and the superconducting wiring (superconducting circuit) 54 easily while keeping the impedance of the wiring 54 made of a superconducting material constant.

The superconducting integrated circuit 50 as described above is produced as follows. First, the thin dielectric film 53 made of a material similar to the reinforcing crystal substrate 35 and a superconducting thin oxide film made of superconducting oxide polycrystal are formed by a vapor phase deposition process such as laser deposition (PLD) on the superconducting laminated oxide substrate 31 made by the method described previously. Then the superconducting thin oxide film is patterned in the wiring configuration by photolithography thereby to form the superconducting oxide wiring 54. When forming the thin dielectric film 53 and the superconducting thin oxide film, it is preferable to control the heating temperature and the partial pressure of oxygen during film formation, so that the superconducting characteristics of the superconducting oxide crystal substrate 33 does not deteriorate. Then an end of the center conductor 56 is led from the cavity 52 made of copper onto the superconducting oxide wiring 54, thereby establishing an electric connection. The superconducting integrated circuit 50 as shown in FIGS. 8A and 8B is thus obtained.

The superconducting integrated circuit 50, since it is made in the constitution described above, makes it possible to achieve a connection that involves less signal loss caused by the reflection of high-frequency signals, thereby achieving a superconducting circuit that operates at a high speed.

Also because the superconducting integrated circuit 50 is made by using the superconducting laminated oxide substrate 31 made as described previously, the occurrence of cracks in the superconducting oxide crystal substrate 33 can be greatly reduced and the production yield in the electronic device manufacturing process can be greatly improved even when the heat treatment is applied when forming the thin dielectric film 53 and the superconducting thin oxide film on the laminated substrate 31.

Figure 9A:
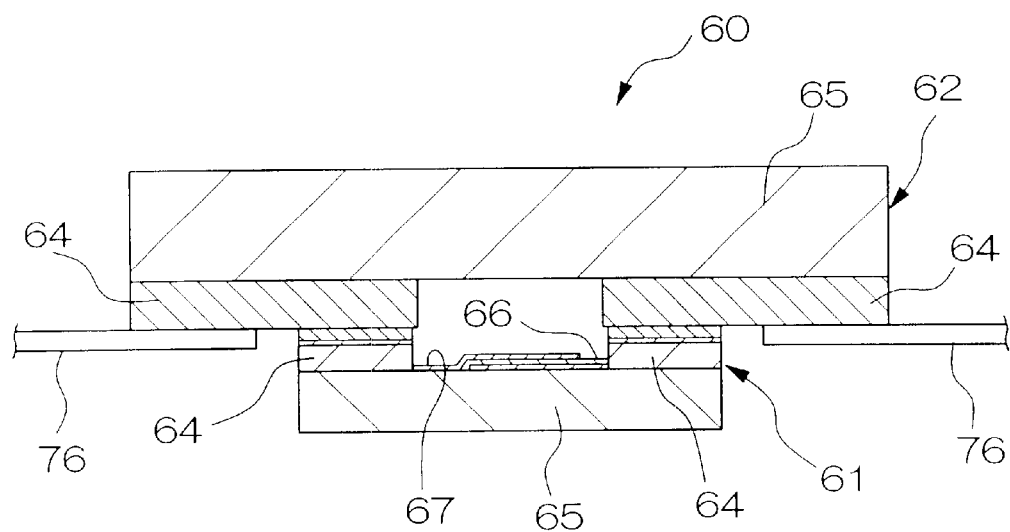
FIGS. 9A and 9B show a superconducting integrated circuit produced by another embodiment of the method of producing the superconducting integrated circuit according to the present invention, with FIG. 9A being a side view and FIG. 9B being a bottom view thereof.
Figure 9B:
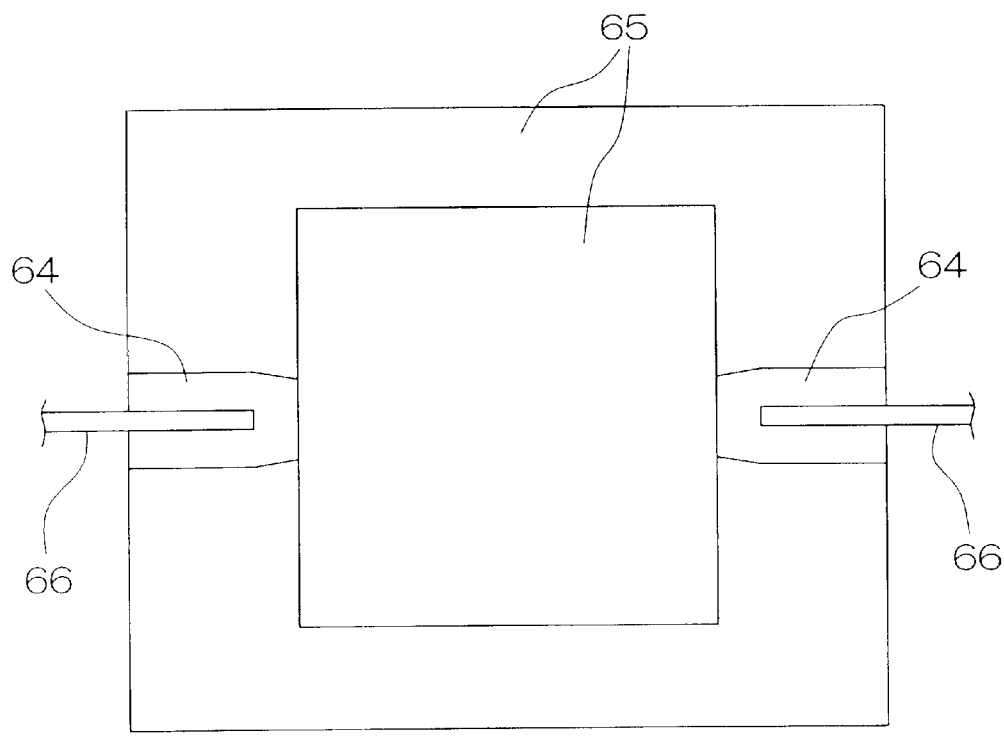

FIGS. 9A and 9B show the superconducting integrated circuit produced by the second embodiment of the method of producing the superconducting integrated circuit according to the present invention, with FIG. 9A being a side view and FIG. 9B being a bottom view thereof.

The superconducting integrated circuit 60 is made by forming an insulation film (inter-layer insulation film) 66 and a superconducting oxide circuit 67 on first superconducting laminated oxide substrate 61, located at the lower position of the first and second superconducting laminated oxide substrates which oppose each other and are made by forming superconducting oxide wiring 64 from the superconducting oxide polycrystal of the composition described above on a dielectric substrate 65, with the superconducting oxide wiring 64, 64 of the first and second superconducting laminated oxide substrates 61, 62 being fastened to each other, and a center conductor 76 being connected to the superconducting oxide wiring 64 of the second superconducting laminated oxide substrate 62.

The first superconducting laminated oxide substrate 61 located below is made smaller than the second superconducting laminated oxide substrate 62 that is located above.

The dielectric substrate 65 is made of a material similar to that of the reinforcing crystal substrate 5 or $SrTiO_3$ that has a high dielectric constant.

Since this configuration establishes a connection over a substantial area but with near-zero distance, the wiring of the connection has an extremely low impedance. The superconducting integrated circuit 60, although retaining a junction resistance similar to the case of the superconducting integrated circuit 50 described previously, allows easy connection with the impedance matched between an external circuit and the superconducting oxide circuit 67.

Consequently, a connection with less signal loss caused by the reflection of high-frequency signals can be achieved by making the superconducting integrated circuit 60 with the configuration described above.

Figure 10A:
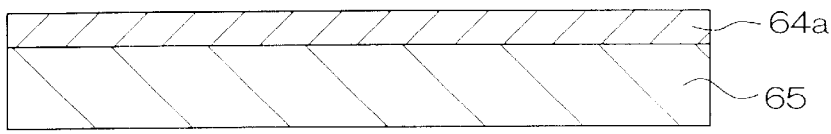
FIGS. 10A to 10F are drawings showing the method of producing the superconducting integrated circuit according to the present invention shown in FIGS. 9A and 9B, in the order of the production process.

The superconducting integrated circuit 60 is produced as follows. After forming a superconducting thin oxide film 64a from superconducting oxide polycrystal by the LPE (Liquid Phase Epitaxy) process on the dielectric substrate 65 as shown in FIG. 10A, the superconducting thin oxide film 64a is removed by photolithography while leaving portions that will become electrode pads, thereby forming the superconducting oxide wiring 64 as the electrode pad and making the first superconducting laminated oxide substrate 61. The electrode pad is made with a size of, for example, about 0.5 mm in diameter. Then a superconducting ground plane 68 is formed by a vapor phase deposition process on the surface of the dielectric substrate 65 whereon the superconducting oxide wiring 64 has been formed, as shown in FIG. 10C.

Figure 10B:
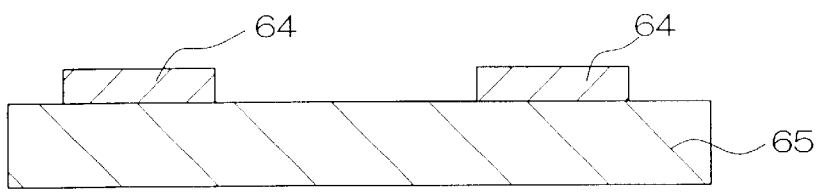
Figure 10C:
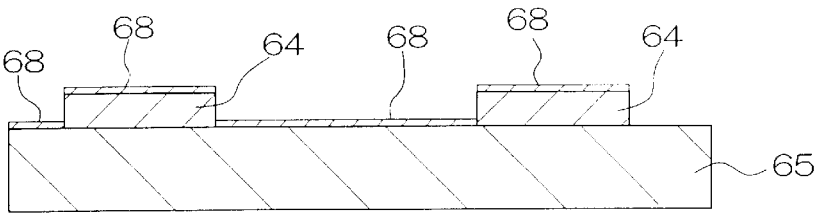
Figure 10D:
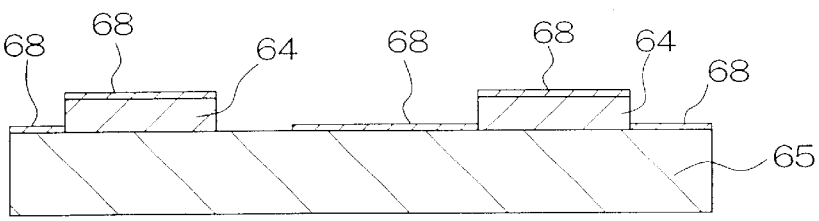

The superconducting ground plane 68 is then patterned as shown in FIG. 10D. At this time, the superconducting ground plane 68 is removed from portions around the superconducting oxide wiring 64 that is connected to the electrode (upper electrode) of the second superconducting laminated oxide substrate 62 which is disposed at an upper of position, thereby cutting off the electrical connection. A groove structure for alleviating the effect of trapping the magnetic flux is also provided.

Figure 10E:
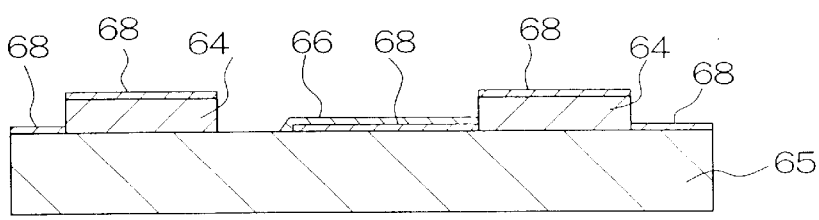
Figure 10F:
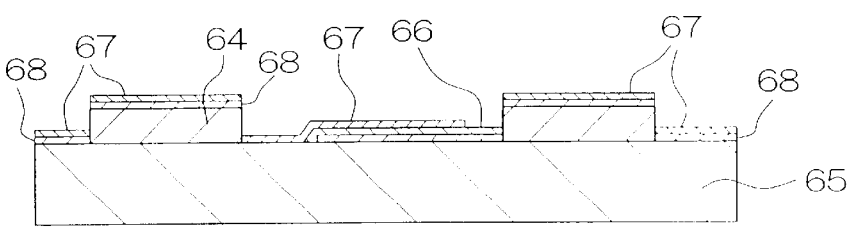

Then after forming the inter-layer insulation film 66 on the superconducting ground plane 68 between the superconducting oxide wiring 64, 64 as shown in FIG. 10E, the superconducting thin oxide film is formed by the laser vapor deposition process or the like on the superconducting ground plane 68 and the inter-layer insulation film 66, and the superconducting thin oxide film is patterned thereby to form the superconducting oxide circuit 67 shown in FIG. 10F.

Meanwhile, the superconducting oxide wiring 64 is formed on the dielectric substrate 65 similarly to the process shown in FIGS. 10A through 10B, thereby making the second superconducting laminated oxide substrate 62.

Then with the superconducting oxide wirings 64, 64 of the first and second superconducting laminated oxide substrates 61, 62 being brought into contact with each other via the superconducting oxide circuit (superconducting thin oxide film) 67, heat treatment is applied similarly to the method of producing the superconducting integrated circuit of the embodiment described previously, thereby connecting the superconducting oxide wiring 64, 64 of the first and second superconducting laminated oxide substrates 61, 62 with each other by sintering. When the superconducting oxide wiring 64 of the second superconducting laminated oxide substrate 62 and the center conductor 76 are connected, the superconducting integrated circuit 60 shown in FIGS. 9A and 9B is obtained.

According to the method of producing the superconducting integrated circuit described above, the wiring 64, 64 of the upper and lower superconducting laminated oxide substrates 61, 62 can be easily connected because of the constitution described above.

EXAMPLES

The present invention will now be described in detail below by way of Examples, but it should be understood that the present invention is not limited to these Examples.

Experimental Example 1

A rod made of single crystal $YBa_2CU_3O_y$ (decomposition temperature 1010° C.) by the withdrawal method was sliced and polished to make a $YBa_2CU_3O_y$ crystal substrate of sheet shape measuring 8 mm by 8 mm and 2.0 mm thick.

The $YBa_2CU_3O_y$ crystal substrate was sandwiched by MgO crystal substrates (melting point 2830° C.) of sheet shape on both sides thereof, thus making a laminate.

Figure 2:
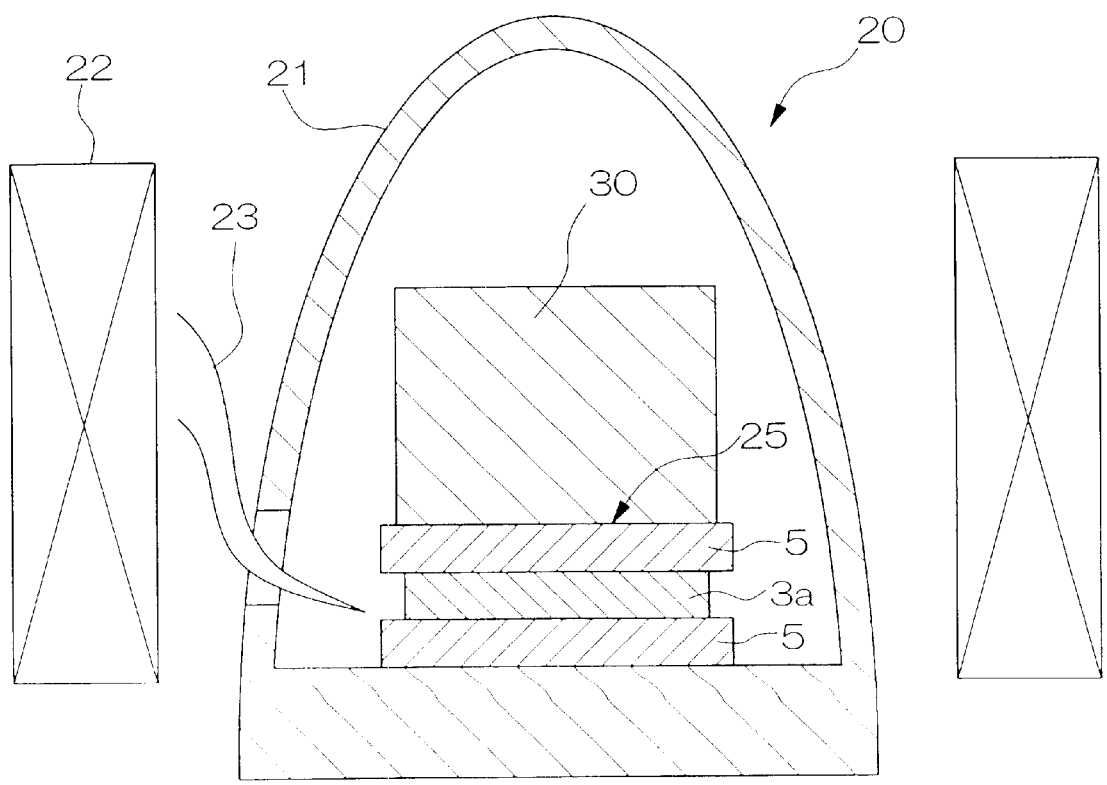
FIG. 2 is drawing schematically showing the constitution of a heating furnace preferably used in the embodiment of the method of producing the superconducting laminated oxide substrate of the present invention.
Figure 3:
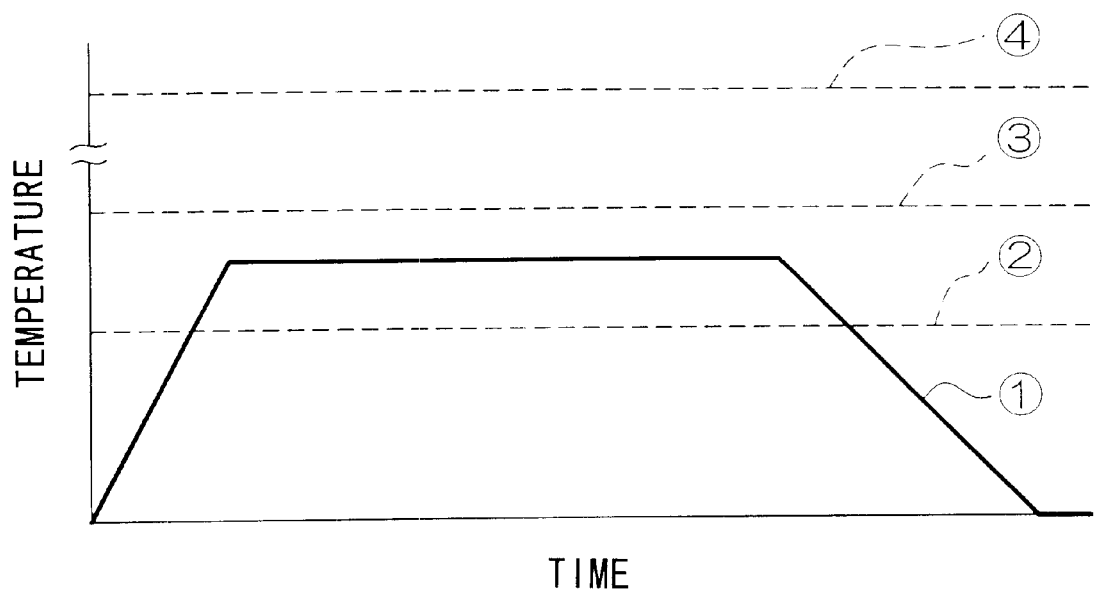
FIG. 3 shows an example of the pattern of the heating cycle during the heat treatment in the method of producing the superconducting laminated oxide substrate according to an embodiment of the present invention.

After putting the laminate in the processing vessel 21 shown in FIG. 2, a weight 30 was placed on the laminate to apply a load of 100 gf and the temperature was raised by the heater 22 from room temperature to 995° C. at a rate of 100° C. /hour. After maintaining this temperature for 20 hours, the temperature was lowered from 995° C. to room temperature at a rate of 100° C. /hour, thereby bonding the MgO crystal substrates on both sides of the $YBa_2Cu_3O_y$ crystal substrate. The $YBa_2Cu_3O_y$ crystal substrate was sliced along a plane parallel to the surface to thereby obtain two laminated substrates (Example 1).

The laminated substrate of Example 1 obtained as described above and a $YBa_2Cu_3O_y$ crystal substrate (measuring 8 mm by 8 mm and 1.0 mm thick) made as Comparative Example 1 without bonding an MgO crystal substrate were heated at a rate of 750 K/hour to 750° C. with a heat history similar to that for forming the insulation film and the conductor film of the circuit. After heating at 750° C. for three hours, the temperature was lowered at a rate of 750 K/hour to room temperature, and the density of the generated cracks was checked. It was found that the density of generated cracks in the laminated substrate of Example 1 was as low as one tenth that of the substrate of Comparative Example 1, which was not reinforced by the MgO crystal substrate. Thus the laminated substrate of Example 1 provided the notable effect of preventing the generation of cracks in association with the heat treatment conducted to form the insulation film and the conductor film, and showed a marked improvement in the strength.

Experimental Example 2

Various laminated substrates were made in the same manner as in Experimental Example 1, except for changing the holding temperature from 950° C. to 1000° C., which was kept during the heat treatment of the laminate made similarly to Experimental Example 1 under a load.

The bonding performance of the laminated substrates thus obtained with the $YBa_2Cu_3O_y$ crystal substrate and the MgO crystal substrate was studied. Those made with a holding temperature in a range from 990° C. to 997° C. showed good bonding performance, while part of the $YBa_2Cu_3O_y$ crystal substrate was melted in those made with a holding temperature of 1000° C. and the $YBa_2Cu_3O_y$ crystal substrate and the MgO crystal substrate did not bond at all in those made with a holding temperature of 950° C. These results show that the heat treatment temperature for thermal compression bonding of the substrate made of $YBa_2Cu_3O_y$ single crystal and the MgO crystal substrate is preferably in a range from 990° C. to 997° C.

Experimental Example 3

Various laminated substrates were made in the same manner as in Experimental Example 1, except for slicing the rod made of $YBa_2Cu_3O_y$ single crystal by the withdrawal method along the cleavage plane of the $YBa_2Cu_3O_y$ single crystal when making the $YBa_2Cu_3O_y$ crystal substrate of sheet shape, or employing mirror polishing or rough polishing to be applied to the surface of the $YBa_2Cu_3O_y$ crystal substrate whereon the MgO crystal substrate was to be bonded.

The bonding performance of the laminated substrate thus obtained between the $YBa_2Cu_3O_y$ crystal substrate and the MgO crystal substrate was studied. The best bonding performance was obtained with the cleavage plane, followed by rough polishing (surface roughness 10 μm), with mirror polishing (surface roughness within 1 μm) being the worst. Thus it was shown that the $YBa_2Cu_3O_y$ crystal substrate having the best bonding performance could be obtained by slicing the rod made of $YBa_2Cu_3O_y$ crystal substrate along the cleavage plane of the $YBa_2Cu_3O_y$ crystal substrate.

Experimental Example 4

Laminated substrates were made in the same manner as in Experimental Example 1, except for slicing the rod made of $YBa_2Cu_3O_y$ single crystal by the withdrawal method along the cleavage plane of the $YBa_2Cu_3O_y$ single crystal when making the $YBa_2Cu_3O_y$ crystal substrate of sheet shape, and setting the holding temperature to 997° C., holding time to 140 hours and load to 0.25 g/mm² during heat treatment under load. The laminated substrates were subjected to long-term compression bonding testing.

The bonding performance of the laminated substrate thus obtained between the substrate made of $YBa_2Cu_3O_y$ single crystal and the MgO crystal substrate was studied, and good bonding was shown between the $YBa_2Cu_3O_y$ crystal substrate and the MgO crystal substrate.

Experimental Example 5

A $YBa_2Cu_3O_y$ crystal substrate having thickness of 0.3 mm made in the same manner as in Experimental Example 1 was machined to have a trapezoidal cross section, and a $YBa_2Cu_3O_y$ crystal substrate similar to that of FIG. 5 was made.

Meanwhile an MgO crystal substrate 0.3 mm thick having a fitting hole for fitting the $YBa_2Cu_3O_y$ crystal substrate formed therein was prepared, and a $YBa_2Cu_3O_y$ polycrystal thin film was formed by laser deposition method on the surface of the fitting hole. The film was formed in an $O_2$ atmosphere of 200 mTorr at 740° C.

After fitting the $YBa_2Cu_3O_y$ crystal substrate in the fitting hole of the MgO crystal substrate and putting the substrate in the processing vessel 21 shown in FIG. 2 with the inside thereof being made an oxygen atmosphere, the temperature was raised by the heater 22 from room temperature to 920° C. at a rate of 100° C. /hour. After keeping this temperature for two hours, the temperature was lowered from 920° C. to room temperature at a rate of 100° C. /hour, thereby bonding the $YBa_2Cu_3O_y$ crystal substrate and the $YBa_2Cu_3O_y$ polycrystal thin film formed on the MgO crystal substrates by sintering. The surfaces of the $YBa_2Cu_3O_y$ crystal substrate and the MgO crystal substrate whereon wiring was to be formed were made flat by polishing, thereby to obtain a laminated substrate similar to that of FIG. 5 (i.e.,Example 2).

The holding temperature during the heat treatment can be made lower by applying a pressure from both sides on the $YBa_2Cu_3O_y$ crystal substrate and the $YBa_2Cu_3O_y$ polycrystal thin film, and bonding could be achieved even at 900° C. when a stainless steel spring was used. When the holding temperature during the heat treatment was raised to 960° C. or higher, bonding was achieved without external load, namely by the sample's own weight.

Then a thin film of MgO 0.3 mm thick and a $YBa_2Cu_3O_y$ polycrystal thin film 0.3 m thick were formed by the laser deposition method on the laminated substrate obtained in Example 2. The thin film of MgO and the $YBa_2Cu_3O_y$ polycrystal thin film were formed in an $O_2$ atmosphere of 200 mTorr (1 Torr is about 133 Pa) at 740° C., in order to avoid deterioration of the superconducting characteristics of the $YBa_2Cu_3O_y$ crystal substrate.

Then the $YBa_2Cu_3O_y$ polycrystal thin film was patterned by photolithography to form $YBa_2Cu_3O_y$ wiring. The line width of the $YBa_2Cu_3O_y$ wiring was set to 0.3 $\mu$m at the middle of the circuit and 0.3 mm at the connecting portion with the external circuit.

Then an end of the center conductor was led from the cavity 52 made of copper similar to that shown in FIGS. 8A and 8B to the $YBa_2Cu_3O_y$ wiring, thereby establishing an electric connection to obtain a superconducting integrated circuit similar to that of FIGS. 8A and 8B. A K connector having good high-frequency transmission characteristics and good electrical connection characteristics were obtained with this constitution.

Temperature dependency of the resistance between the connecting surfaces of the superconducting integrated circuit obtained as described above was studied. The resistance between the connecting surfaces was measured by the four-terminal method. The results are shown in FIG. 11.

The results shown in FIG. 11 indicate that the resistance drops steeply as the electrode experiences a transition to the superconducting state when the temperature drops below 90K. However, the electrode-voltage characteristics show that a superconducting current does not flow, which indicates that resistance remains between the electrodes. The remaining resistance is caused by the barrier layer in the crystal grain boundary, and does not affect the high-frequency characteristics of the circuit. The resistance can also be decreased by applying a proper surface treatment before bonding.

Experimental Example 6

A rod made of a $YBa_2Cu_3O_y$ single crystal (decomposition temperature 1010° C.) by the withdrawal method was sliced and polished to make a $YBa_2Cu_3O_y$ crystal substrate of sheet shape measuring 8 mm by 8 mm and 1 mm thick.

The surface of a MgO crystal substrate (melting point 2830° C.) of sheet shape was coated with a paste that included $YBa_2Cu_3O_y$ (decomposition temperature 875° C.) as the major component, and then a $YBa_2Cu_3O_y$ crystal substrate was laminated thereon, thereby forming a laminate.

With the laminate being put in the processing vessel 21 as shown in FIG. 2, the temperature was raised by the heater 22 from room temperature to 950° C. at a rate of 100° C. /hour. After maintaining this temperature for 20 hours, the temperature was lowered from 950° C. to room temperature at a rate of 100° C. /hour, thereby bonding the $YBa_2Cu_3O_y$ crystal substrate and the MgO crystal substrates to obtain the laminated substrate (Example 3).

The laminated substrate of Example 3 obtained as described above and a $YBa_2Cu_3O_y$ crystal substrate (measuring 8 mm by 8 mm and 1 mm thick) prepared as Comparative Example 3 without bonding MgO crystal substrate were heated at a rate of 750 K/hour to 750° C. through a heat history similar to that of forming the insulation film and the conductor film of the circuit. After heating at 750° C. for three hours, the temperature was lowered at a rate of 750 K/hour, and the density of generated cracks was checked. It was found that the density of cracks generated in the laminated substrate of Example 3 was as low as one tenth that of the substrate Comparative Example 3 that was not reinforced by the MgO crystal substrate. Thus the laminated substrate of Example 3 provided the notable effect of preventing the generation of cracks in association with the heat treatment conducted to form the insulation film and the conductor film, and showed a marked improvement in the strength.

What is claimed is:

1. A superconducting laminated oxide substrate comprising a laminate of a layer of a superconducting oxide crystal substrate made of a superconducting oxide single crystal or a superconducting oxide polycrystal, and a layer of a reinforcing crystal substrate.

2. A superconducting laminated oxide substrate according to claim 1, wherein the superconducting oxide crystal substrate and the reinforcing crystal substrate are bonded by thermal compression.

3. A superconducting laminated oxide substrate according to claim 1, comprising a superconducting oxide crystal substrate, and a reinforcing crystal substrate having a superconducting thin oxide film formed on the surface thereof, wherein said superconducting thin oxide film and said superconducting oxide crystal substrate are bonded by thermal compression.

4. A superconducting laminated oxide substrate according to claim 1, wherein the superconducting oxide crystal substrate, and the reinforcing crystal substrate are bonded via an intermediate layer that consists of one or more layer, while at least the outermost layer of said intermediate layer consists of a low melting point layer made of a material that has a melting point lower than the decomposition temperature of the superconducting oxide single crystal or the superconducting oxide polycrystal that constitutes the superconducting oxide crystal substrate.

5. A superconducting laminated oxide substrate according to claim 4, wherein the low melting point material that makes said low melting point layer is a superconducting oxide powder that has a decomposition temperature which is lower than the decomposition temperature of the superconducting oxide single crystal or the superconducting oxide polycrystal that constitutes the superconducting oxide crystal substrate.

6. A method of producing a superconducting laminated oxide substrate, which comprises bringing a superconducting oxide crystal substrate made of a superconducting oxide single crystal or a superconducting oxide polycrystal into contact with a reinforcing crystal substrate, and subjecting them to heat treatment, thereby bonding said superconducting oxide crystal substrate and said reinforcing crystal substrate on the interface thereof.

7. A method of producing a superconducting laminated oxide substrate, which comprises sandwiching a superconducting oxide crystal substrate made of a superconducting oxide single crystal or a superconducting oxide polycrystal by reinforcing crystal substrates on both sides thereof, subjecting to a heat treatment, thereby bonding the reinforcing crystal substrates onto both surfaces of the superconducting oxide crystal substrate, and slicing the superconducting oxide crystal substrate along a plane parallel to the surface.

8. A method of producing a superconducting laminated oxide substrate, which comprises bringing a superconducting oxide crystal substrate made of a superconducting oxide single crystal or a superconducting oxide polycrystal into contact with a superconducting thin oxide film of a reinforcing crystal substrate having the superconducting thin oxide film formed on the surface thereof and subjecting to a heat treatment, thereby bonding said superconducting oxide crystal substrate and said superconducting thin oxide film on the interface thereof.

9. A method of producing a superconducting laminated oxide substrate according to claim 6, wherein said heat treatment is carried out under a load.

10. A method of producing a superconducting laminated oxide substrate according to claim 7, wherein said heat treatment is carried out under a load.

11. A method of producing a superconducting laminated oxide substrate according to claim 8, wherein said heat treatment is carried out under a load.

12. A method of producing a superconducting laminated oxide substrate according to claim 9, wherein the load applied during said heat treatment is in a range from 5 to 1000 g/cm$^2$.

13. A method of producing a superconducting laminated oxide substrate according to claim 10, wherein the load applied during said heat treatment is in a range from 5 to 1000 g/cm$^2$.

14. A method of producing a superconducting laminated oxide substrate according to claim 11, wherein the load applied during said heat treatment is in a range from 5 to 1000 g/cm$^2$.

15. A method of producing a superconducting laminated oxide substrate according to claim 6, wherein the surface roughness of at least one of the contact surfaces of said superconducting oxide crystal substrate and said reinforcing crystal substrate is controlled in a range from 0.01 to 50 $\mu$m.

16. A method of producing a superconducting laminated oxide substrate according to claim 7, wherein the surface roughness of at least one of the contact surfaces of said superconducting oxide crystal substrate and said reinforcing crystal substrate is controlled in a range from 0.01 to 50 $\mu$m.

17. A method of producing a superconducting laminated oxide substrate according to claim 8, wherein the surface roughness of at least one of the contact surfaces of said superconducting oxide crystal substrate and said reinforcing crystal substrate is controlled in a range from 0.01 to 50 $\mu$m.

18. A method of producing a superconducting laminated oxide substrate according to claim 6, wherein the heat treatment temperature used in said heat treatment is lower than the melting point (Mp) of the superconducting oxide single crystal or the superconducting oxide polycrystal that constitutes said superconducting oxide crystal substrate and higher than Mp–100 (K).

19. A method of producing a superconducting laminated oxide substrate according to claim 7, wherein the heat treatment temperature used in said heat treatment is lower than the melting point (Mp) of the superconducting oxide single crystal or the superconducting oxide polycrystal that constitutes said superconducting oxide crystal substrate and higher than Mp–100 (K).

20. A method of producing a superconducting laminated oxide substrate according to claim 8, wherein the heat treatment temperature used in said heat treatment is lower than the melting point (Mp) of the superconducting oxide single crystal or the superconducting oxide polycrystal that constitutes said superconducting oxide crystal substrate and higher than Mp–100 (K).

21. A method of producing a superconducting laminated oxide substrate according to claim 6, wherein the rates of raising and lowering the temperature for heat treatment are in a range from 10 to 500 K/hour.

22. A method of producing a superconducting laminated oxide substrate according to claim 7, wherein the rates of raising and lowering the temperature for heat treatment are in a range from 10 to 500 K/hour.

23. A method of producing a superconducting laminated oxide substrate according to claim 8, wherein the rates of raising and lowering the temperature for heat treatment are in a range from 10 to 500 K/hour.

24. A method of producing a superconducting laminated oxide substrate according to claim 6, wherein the duration of said heat treatment is in a range from 1 to 300 hours.

25. A method of producing a superconducting laminated oxide substrate according to claim 7, wherein the duration of said heat treatment is in a range from 1 to 300 hours.

26. A method of producing a superconducting laminated oxide substrate according to claim 8, wherein the duration of said heat treatment is in a range from 1 to 300 hours.

27. A superconducting laminated oxide substrate according to claim 1, wherein the superconducting oxide crystal substrate in the form of a sheet having a polished surface and the reinforcing crystal substrate are bonded.

* * * * *